(12) United States Patent
Maeda et al.

(10) Patent No.: US 7,980,911 B2
(45) Date of Patent: Jul. 19, 2011

(54) METHOD OF PRODUCING A LIGHT EMITTING APPARATUS PROVIDED WITH AN INSULATING FILM BETWEEN REFLECTIVE LAYERS AND PATTERNED ANODES FORMED OF DIFFERENT THICKNESSES

(75) Inventors: Tsuyoshi Maeda, Kai (JP); Tomotaka Matsumoto, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

(21) Appl. No.: 12/382,039

(22) Filed: Mar. 6, 2009

(65) Prior Publication Data

US 2009/0215354 A1 Aug. 27, 2009

Related U.S. Application Data

(63) Continuation of application No. 11/357,175, filed on Feb. 21, 2006, now Pat. No. 7,538,490.

(30) Foreign Application Priority Data

Mar. 25, 2005 (JP) ................. 2005-087930

(51) Int. Cl.
*H01L 51/56* (2006.01)
(52) U.S. Cl. ............... 445/24; 445/25; 427/66
(58) Field of Classification Search .......... 445/24, 445/25; 427/66; 313/500–512
See application file for complete search history.

(56) References Cited

U.S. PATENT DOCUMENTS

| 5,405,710 | A | 4/1995 | Dodabalapur et al. |
| 5,554,911 | A | 9/1996 | Nakayama et al. |
| 5,804,918 | A | 9/1998 | Yazawa et al. |
| 6,737,800 | B1 * | 5/2004 | Winters et al. ............... 313/504 |
| 7,580,014 | B2 | 8/2009 | Tanaka et al. |
| 2005/0040756 | A1 | 2/2005 | Winters et al. |

FOREIGN PATENT DOCUMENTS

| JP | A 06-275381 | | 9/1994 |
| JP | 2003229283 A | * | 8/2003 |
| JP | A-2005-19211 | | 1/2005 |
| WO | WO 00/76010 A1 | | 12/2000 |

* cited by examiner

*Primary Examiner* — Mariceli Santiago
(74) *Attorney, Agent, or Firm* — Oliff & Berridge, PLC

(57) ABSTRACT

A light emitting apparatus having light emitting devices having a stack of a light-transmitting anode, a functional layer including at least a light emitting layer, and a cathode for a plurality of pixels corresponding to red, green, and blue colors on a substrate, wherein an optical resonator having a lower-layer-side reflecting layer at a lower-layer side of the anode is formed in the light emitting device, wherein a plurality of the pixels include pixels which correspond to different thicknesses of a anode, and wherein a light-transmitting insulating protective film is formed between the anode and the lower-layer-side reflecting layer to cover the lower-layer-side reflecting layer.

3 Claims, 3 Drawing Sheets

METHOD OF PRODUCING A LIGHT EMITTING APPARATUS PROVIDED WITH AN INSULATING FILM BETWEEN REFLECTIVE LAYERS AND PATTERNED ANODES FORMED OF DIFFERENT THICKNESSES

This is a Continuation of application Ser. No. 11/357,175 filed Feb. 21, 2006, which claims the benefit of Japanese Patent Application No. 2005-087930 filed Mar. 25, 2005. The disclosure of the prior applications is hereby incorporated by reference herein in its entirety.

BACKGROUND

1. Technical Field

The present invention relates to a light emitting apparatus and an electronic apparatus having a light emitting device such as an organic EL device.

2. Related Art

Much attention has been paid to display apparatus used for electronic apparatuses such as a mobile phone, a personal computer, and a PDA (Personal Digital Assistant) or light emitting apparatuses such as an organic EL (Electroluminescence) apparatus used as an exposing head in an image forming apparatus such as a digital copier and a printer. Conventionally, when such kinds of light emitting apparatuses are constructed as a color type, light of each color emits from each pixel by varying materials constituting a light emitting layer for each pixel.

On the other hand, there has been proposed a technique for extracting light of each color from an emitting light of the light emitting device by disposing an optical resonator between a lower-layer-side reflecting layer formed on a lower-layer side of the light emitting layer and an upper-layer-side reflecting layer formed on an upper layer side of the light emitting layer and varying optical lengths of the optical resonator for each pixel by changing thicknesses of positive electrodes (see Japanese Patent No. 2,797,883)

In a case where a bottom emission type organic EL apparatus which emits light to a substrate side as seen from the light emitting layer is constructed by using a technique disclosed in Japanese Patent No. 2,797,883, the lower-layer-side reflecting layer is constructed with a semi-transparent reflecting film. In addition, in a case where a top emission type organic EL apparatus which emits light to an opposite side of the substrate as seen from the light emitting layer is constructed, the lower-layer-side reflecting layer is constructed with a metal film having a high reflectance such as aluminum and silver.

In addition, in order to construct the positive electrode with an ITO film, the ITO film is prepared, and a resist mask is formed on the ITO film by using a photolithography technique, and etching is performed. Therefore, in order to form different thicknesses of the positive electrodes for the red, green, and blue pixels, the aforementioned process is needed to repeat thee times. As a result, there is a problem in that, since the lower-layer-side reflecting layer is also etched by an etching solution or gas used to etch the ITO film, deterioration in reflecting characteristics of the lower-layer-side reflecting layer or a loss of the lower-layer-side reflecting layer occurs. The occurrence of the etching of the lower-layer-side reflecting layer is not limited to an etching end period when the lower-layer-side reflecting layer is exposed from the ITO, but the etching of the lower-layer-side reflecting layer may occur just before the etching starts.

SUMMARY

An advantage of the invention is that it provides a light emitting apparatus where a lower-layer-side reflecting layer used for an optical resonator and disposed at a lower-layer side of each of positive electrodes does not deteriorate even in case of forming different thicknesses of the positive electrodes according to pixels and an electronic apparatus having the light emitting apparatus.

According to an aspect of the present invention, there is provided a light emitting apparatus having light emitting devices having a stack of a light-transmitting anode, a functional layer including at least a light emitting layer, and a cathode for a plurality of pixels corresponding to red, green, and blue colors on a substrate, wherein an optical resonator having a lower-layer-side reflecting layer at a lower-layer side of the anode is formed in the light emitting device, wherein a plurality of the pixels include pixels which correspond to different thicknesses of a anode, and wherein a light-transmitting insulating protective film is formed between the anode and the lower-layer-side reflecting layer to cover the lower-layer-side reflecting layer.

In addition, since a plurality of the pixels include pixels which correspond to different thicknesses of the anode, although the etching processes are performed several times when the anode is formed, according to the invention, the light-transmitting insulating protective film covering the lower-layer-side reflecting layer is disposed between the anode and the lower-layer-side reflecting layer, after the lower-layer-side reflecting layer is formed, although any times of the etching processes are performed to form the anode, the etching cannot cause deterioration of the lower-layer-side reflecting layer.

In the aforementioned aspect, the lower-layer-side reflecting layer may have a total reflecting property, and light generated by the light emitting layer may emit to an opposite side of the substrate as seen from the light emitting layer. In this case, although a high reflectance is required for the lower-layer-side reflecting layer, according to the invention, the etching related to the formation of the anode does not cause deterioration of the lower-layer-side reflecting layer, so that the lower-layer-side reflecting layer having a high reflectance can be constructed.

In addition, in case of increasing reflectance of the lower-layer-side reflecting layer, the lower-layer-side reflecting layer may be made of any one of aluminum, an aluminum alloy, silver, and a silver alloy. Although the metal layer can easily deteriorate due to an etching solution or an etching gas, according to the embodiment, the etching related to the formation of the lower-layer-side reflecting layer cannot deteriorate the reflecting layer.

In addition, each of the thicknesses of the positive layer may be defined so as to correspond an optical length of the optical resonator for each pixel to one of red, green, and blue lights, thereby defining a color corresponding to each pixel. In the light emitting apparatus having the aforementioned construction, although a plurality f the pixels correspond to red, green, and blue colors, the materials for the organic functional layers constituting the light emitting device are common to the pixels irrespective of corresponding colors, and the corresponding color is determined by thicknesses of the anode. Namely, in the invention, the optical resonator is provided to each of the pixels, and the optical length of the optical resonator is defined as a length corresponding to one of the red, green, and blue lights according to the thickness of the anode. Accordingly, since the lifetimes of the light emitting devices are the same irrespective of which colors the pixels correspond to, the lifetime of the light emitting apparatus can be prolonged. In addition, when the light emitting apparatus is manufactured, the same material is used for the pixels, it is possible to improve productivity.

In this case, a refraction index of the insulating protective film may be lower than that of the anode. If the insulating protective film is formed between the lower-layer-side reflecting layer and the anode, the optical length (thickness× refraction index) of the insulating protective film is included in the optical length of the optical resonator. Here, since the optical length required for the optical resonator is determined for each color corresponding to each pixel, if the refraction index of the insulating protective film is high, the anode must be thinned, so that an accuracy of the thickness of the positive protective layer is lowered. However, in the invention, since the insulating protective film has a low refraction index, the anode can be thickened, and if the anode is thick, there is an advantage in that the accuracy of the thickness can be heightened.

In this case, the insulating protective film may be constructed with any one of a silicon nitride film, a silicon oxide film, and a resin. Sine the insulating film has a low refraction index, the insulating film is preferred.

In addition, wherein red, green, and blue color filters may be disposed at light-emitting sides of the red, green, and blue pixels, respectively. By doing so, a calorimetric purity of light emitting from each pixel can be further heightened.

In addition, the light emitting device may be an electroluminescence device.

A light emitting apparatus to which the invention is applied may be used as a display apparatus for various electronic apparatus such as a mobile phone, a personal computer, and PDA. In addition, the light emitting apparatus to which the invention is applied may used as an exposing head for an image forming apparatus (electronic apparatus) such as a digital copier and a printer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Now, embodiments of the present invention will be described with reference to the accompanying drawings. In addition, in the figures used for the following description, scales of layers or elements are different from each other in order to show the layers or elements in a perceivable size on the figures.

First Embodiment

Basic Construction of Light Emitting Apparatus

Figure 1:
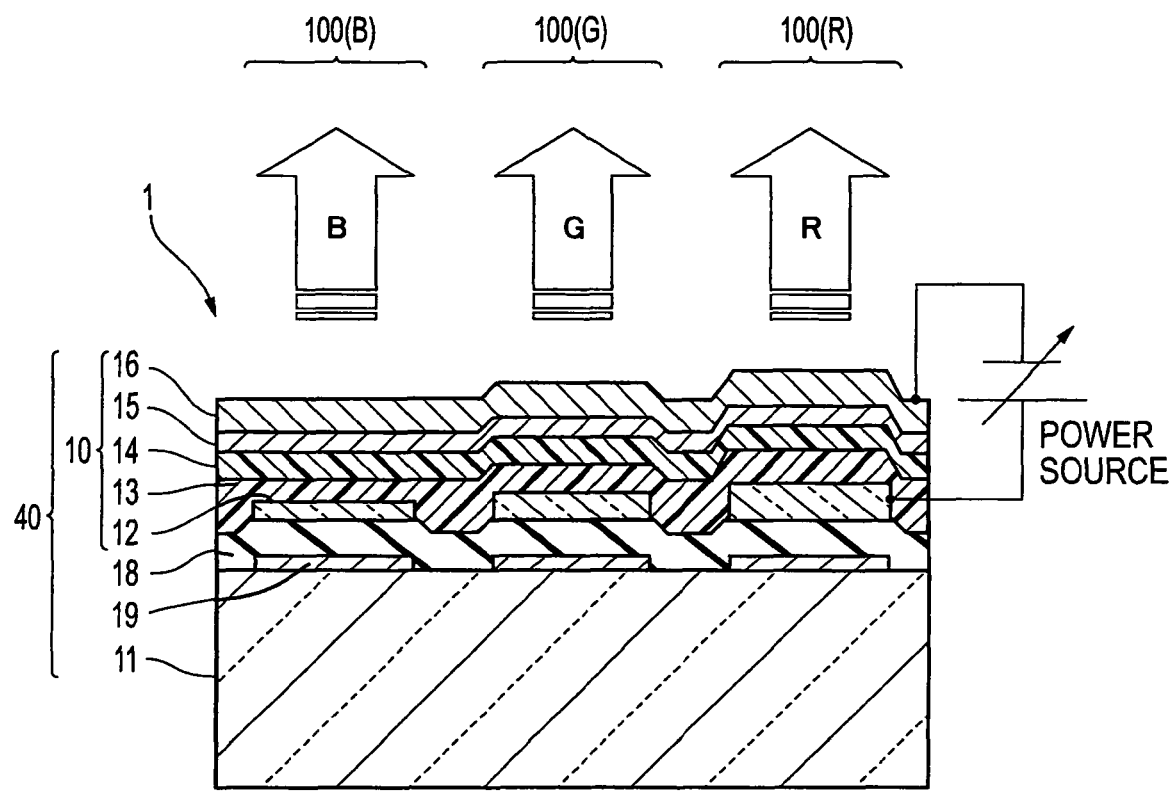
FIG. 1 is a schematic cross sectional view showing an organic EL device (light emitting device) used for an organic EL apparatus (light emitting apparatus) according to a first embodiment.

FIG. 1 is a schematic cross sectional view showing an organic EL device (light emitting device) used for an organic EL apparatus (light emitting apparatus) according to a first embodiment of the invention.

In FIG. 1, the organic EL apparatus 1 according to the embodiment is a top emission type apparatus which emits display light to an opposite side of a substrate 11, and an organic EL device 10 is formed for each of red (R), green (G), and blue (B) pixels 100 (R), (G), and (B). The organic EL device 10 has a construction formed by sequentially stacking a transparent anode 12 made of ITO or the like, a hole transport layer 13, and a cathode 16 made of a magnesium-silver alloy and having a semi-transparent reflecting property on an upper-layer side of the substrate 11 made of a glass or the like.

In addition, a reflecting layer 19 (a total reflecting layer) made of aluminum, an aluminum alloy, silver, or a silver alloy is formed between the substrate 11 and the anode 12, and an optical resonator 40 is formed between a lower-layer-side reflecting layer constructed with the reflecting layer 19 and an upper-layer-side reflecting layer constructed with the cathode 16.

Here, the hole transport layer 13 or the light emitting layer 14 used for the organic EL device 10 is made of the same material for any one of the pixels 100 (R), (G), and (B), and the organic EL device 10 emits white light.

However, in the embodiment, thicknesses of the anode 12 for the pixels 100 (R), (G), and (B) are different from each other, and the thicknesses of the anode 12 have the following relation.

Pixel 100 (B)<Pixel 100 (G)<Pixel 100 (R)

For example, the thicknesses of the anode 12 are defined as the following values for the pixels 100 (R), (G), and (B).

Thickness of Anode 12 for Pixel 100 (B)=20 nm
Thickness of Anode 12 for Pixel 100 (G)=50 nm
Thickness of Anode 12 for Pixel 100 (R)=90 nm The optical lengths of the optical resonator 40 for the pixels 100 (R), (G), and (B) are different from each other according to the pixels 100 (R), (G), and (B). In other words, the thicknesses of the anode 12 are adjusted to correspond an optical length of the optical resonator to each of the pixels 100 (R), (G), and (B), so that a predetermined color light can emit from each of the pixels (R), (G), and (B).

In the organic EL device 10 having the aforementioned construction, if a current flows from the anode 12 through the hole transport layer 13 and the light emitting layer 14 to the cathode 16, the light emitting layer 14 emits light according to an amount of the current. In addition, the light emitting from the light emitting layer 14 passes through the cathode 16 and emits toward an observer's side, and the light emitting from the light emitting layer 14 toward the substrate 11 is reflected on a lower layer of the anode 12, passes through the cathode 16, and emits toward the observer's side. At this time, the light are reflected multiple times between the lower-layer-side reflecting layer (reflecting layer 19) and upper-layer-side reflecting layer (cathode 16) of the optical resonator 40, so that it is possible to improve chromaticity of light corresponding to an optical length of the optical resonator 40 which is a integer times of ¼ wavelength. Therefore, although the white light is generated from an inner portion of the organic EL device 10, the red, green, and blue light emits from the pixels 100 (R), (G), and (B) corresponding to the red (R), green (G), and blue (B) colors, respectively.

Construction of Insulating Protective Film

In addition, in the embodiment, an light-transmitting insulating protective film 18 is formed between the reflecting layer 19 and the anode 12 to cover a surface and side surface of the reflecting layer 19. In the embodiment, the insulating protective film 18 is constructed with a silicon nitride film having a thickness of about 30 nm and a refraction index of 1.8.

Manufacturing Method

In order to manufacture the organic EL apparatus 1 having the aforementioned construction, a metal film (aluminum, an aluminum alloy, silver, or a silver alloy) having a light reflecting property is first formed on a surface of the substrate 11 by using a sputtering method, a vacuum depositing method, or the like, and after that, pattering is performed by using a photolithography technique, so that the reflecting layer 19 is formed.

Next, the insulating protective film 18 constructed with a silicon nitride film is formed on a surface of the reflecting layer 19 by using a CVD method or the like.

Next, after an ITO film having a predetermined thickness is formed on a surface of the insulating protective film 18 by using a sputtering method, a resist mask is formed on an upper layer of the ITO film by using a photolithography technique, and etching is performed. However, in the embodiment, since the thicknesses of the anodes 12 for the pixels 100 (R), (G), and (B) are different from each other, the aforementioned process repeats three times.

Next, the hole transport layer 13 and the light emitting layer 14 are sequentially formed by using an liquid droplet ejecting method, that is, the so-called inkjet method. The liquid droplet ejecting method is a method of ejecting liquid droplets of a liquid material corresponding to a material constituting the hole transport layer 13 or the light emitting layer 14, and performing drying, thereby fixing the material as the hole transport layer 13 or the light emitting layer 14. At that time, preferably, partition walls (not shown) called "bank" are formed around the pixels 100 (R), (G), and (B) to prevent the ejected liquid droplets or liquid material from leaking out.

In the aforementioned method, the hole transport layer 13 may be formed by using, for example, 3,4-polyethylene dioxythiophene/polystyrene sulphonic acid (PEDOT/PSS), that is, a polyolefin derivative as a hole injection material, ejecting a dispersion solution on a predetermined region, and after that, performing drying. In addition, a material for forming the hole transport layer 13 is not limited to the aforementioned ones, and polyphenylene vinylene of which polymer precursor is polytetra-hydrothiophenyl phenylene, 1,1-bis-(4-N,N-ditrilamino phenyl)cyclo hexane, or the like may be used.

In addition, preferably, as a material for forming the light emitting layer 14, a high molecular material having a molecular weight of, for example, 1,000 or more may be used. More specifically, a polyfluorene derivative, a polyphenylene derivative, polyvinyl carbosol, a polythiophene derivative, or a material formed by doping a perylene-based colorant, a coumarin-based colorant, or a rhodamine-based colorant such as rubrene, perylene, 9,10-diphenyl anthracene, tetraphenyl butadiene, nile red, coumarin 6, and quinacridone to these high molecular materials may be used. In addition, as the high molecular materials, a Π-conjugated polymer material where double-bond Π electrons are non-polarized on a polymer chain is suitably used, because the Π-conjugated polymer material is a conductive high molecular material and has an excellent light-emitting performance. In particular, a compound having a fluorene backbone within the molecule, that is, a polyfluorene-based compound may be more suitably used. In addition to the aforementioned materials, a composite for an organic EL device disclosed in JP-A-11-40358, that is, a composite for an organic EL device constructed by including a precursor of a conjugated polymer organic compound and at least one type fluorescent colorant for changing light-emitting characteristics may be used as a material for forming the light-emitting layer.

After the hole transport layer 13 and the light emitting layer 14 are formed, an electron transport layer 15 and a cathode 16 are sequentially formed.

Effect of the Embodiment

As described above, in the embodiment, although a plurality of the pixels 100 correspond to red (R), green (G), and blue (B), the materials for the organic functional layers such as the hole transport layer 13 and the light emitting layer 14 constituting the organic EL device 10 are common to the pixels irrespective of corresponding colors, and the corresponding color is determined by thicknesses of the anode 12. Namely, in the embodiment, the optical resonator 40 is provided to each of the pixels 10, and the optical length of the optical resonator 40 is defined as a length corresponding to one of the red, green, and blue lights according to the thickness of the anode 12. Accordingly, since the lifetimes of the organic EL devices 10 are the same irrespective of which colors the pixels 100 correspond to, the lifetime of the organic EL apparatus 1 can be prolonged. In addition, when the organic EL apparatus 1 is manufactured, the same material is used for the pixels 100, it is possible to improve productivity.

In addition, since a plurality of the pixels 100 include pixels which correspond to different thicknesses of the anode 12, although the etching processes are performed several times when the anode 12 is formed, according to the embodiment, the light-transmitting insulating protective film 18 covering the reflecting layer 12 is disposed between the anode 12 and the reflecting layer 19, after the reflecting layer 19 is formed, although any times of the etching processes are performed to form the anode 12, the etching cannot cause deterioration of the reflecting layer 19. In particular, in the embodiment, the light generated by the light emitting layer 12 emit to an opposite side of the substrate 11 as seen from the light emitting layer 12. In this case, although a high reflectance is required for the reflecting layer 19, according to the embodiment, the etching related to the formation of the anode 12 does not cause deterioration of the reflecting layer 12, so that the reflecting layer 12 having a high reflectance can be constructed. Here, in order to increase the reflectance of the reflecting layer 12, the reflecting layer 12 may be made of aluminum, an aluminum alloy, silver, or a silver alloy. Although the metal layer can easily deteriorate due to an etching solution or an etching gas, according to the embodiment, the etching related to the formation of the reflecting layer 12 cannot deteriorate the reflecting layer 12, so that the reflecting layer 12 can be made of aluminum, an aluminum alloy, silver, or a silver alloy.

In addition, in the embodiment, since the insulating protective film 18 is interposed between the reflecting layer 19 and the anode 12, the optical length (thickness×refraction index) of the insulating protective film 18 is included in the optical length of the optical resonator 40. In this case, if the refraction index of the insulating protective film 18 is high, since the optical length required for the optical resonator 40 is determined for each color corresponding to each pixel, if the refraction index of the insulating protective film 19 is high, the anode 12 must be thinned, so that an accuracy of the thickness of the positive protective layer 12 is lowered. However, in the embodiment, since the insulating protective film 19 is constructed with a silicon film and has a low refraction index of 1.8, the anode 12 can be thickened, and if the anode 12 is thick, there is an advantage in that the accuracy of the thickness can be heightened.

Here, preferably, the refraction index of the insulating protective film 19 is lower the refraction index (=1.95) of the anode 12, and as the material, there is a silicon oxide film, an acryl resin, or the like as well as a silicon nitride film.

Second Embodiment

Figure 2:
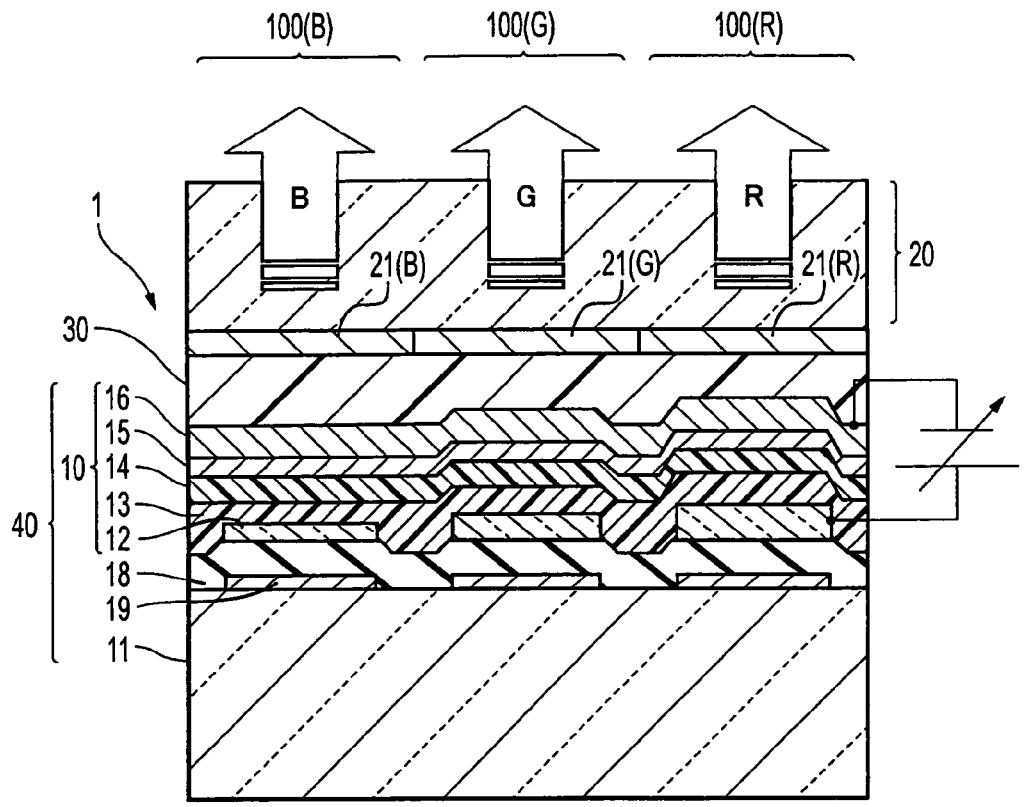
FIG. 2 is a schematic cross sectional view showing an organic EL device (light emitting device) used for an organic EL apparatus (light emitting apparatus) according to a second embodiment.

FIG. 2 is a schematic cross sectional view showing an organic EL device (light emitting device) used for an organic EL apparatus (light emitting apparatus) according to a second embodiment of the invention.

Similarly to the first embodiment, the organic EL apparatus 1 shown in FIG. 2 is a top emission type apparatus which emits display light to an opposite side of a substrate 11, and an organic EL device 10 is formed for each of red (R), green (G), and blue (B) pixels 100 (R), (G), and (B). The organic EL device 10 has a construction formed by sequentially stacking a transparent anode 12 made of ITO or the like, a hole transport layer 13, and a cathode 16 made of a magnesium-silver alloy and having a semi-transparent reflecting property on an upper-layer side of the substrate 11 made of a glass or the like. In addition, a reflecting layer 19 (a total reflecting layer) made of aluminum, an aluminum alloy, silver, or a silver alloy is formed between the substrate 11 and the anode 12, and an optical resonator 40 is formed between a lower-layer-side reflecting layer constructed with the reflecting layer 19 and an upper-layer-side reflecting layer constructed with the cathode 16. In addition, the hole transport layer 13 or the light emitting layer 14 used for the organic EL device 10 is made of the same material for any one of the pixels 100 (R), (G), and (B), and the organic EL device 10 emits white light.

However, in the embodiment, thicknesses of the anode 12 for the pixels 100 (R), (G), and (B) are different from each other, and the thicknesses of the anode 12 have the following relation.

Pixel 100 (B)<Pixel 100 (G)<Pixel 100 (R)

For example, the thicknesses of the anode 12 are defined as the following values for the pixels 100 (R), (G), and (B).
Thickness of Anode 12 for Pixel 100 (B)=40 nm
Thickness of Anode 12 for Pixel 100 (G)=70 nm
Thickness of Anode 12 for Pixel 100 (R)=110 nm
Namely, the thicknesses of the anode 12 are adjusted to correspond an optical length of the optical resonator to each of the pixels 100 (R), (G), and (B), so that a predetermined color light can emit from each of the pixels (R), (G), and (B).

In addition, in the embodiment, an light-transmitting insulating protective film 18 is formed between the reflecting layer 19 and the anode 12 to cover a surface and side surface of the reflecting layer 19. In the embodiment, the insulating protective film 18 is constructed with a silicon nitride film having a thickness of about 30 nm and a refraction index of 1.5.

A method of manufacturing the organic EL apparatus 1 having the aforementioned construction is the same as that of the first embodiment, and thus, description thereto is omitted. However, in the embodiment, since the light-transmitting insulating protective film 18 covering the reflecting layer 19 is disposed between the reflecting layer 19 and the anode 12, after the reflecting layer 19 is formed, although any times of etching processes are performed to form the anode 12, the etching cannot cause deterioration of the reflecting layer 19, so that the same effect as that of the first embodiment can be obtained.

In addition, in the embodiment, in an upper-layer side of the cathode 16, a transparent substrate 20 is attached at positions corresponding to the pixels 100 (R), (G), and (B) by using an epoxy-based transparent adhesive layer 30. Therefore, according to the embodiment, light having a high calorimetric purity can emit from the pixels 100 (R), (G), and (B) in comparison to the first embodiment.

Other Embodiments

Although a top emission type apparatus which emits display light to an opposite side of the substrate 11 is exemplified in the aforementioned embodiments, the invention may be applied to a bottom emission type apparatus which emits the display light to the substrate side. Namely, in the bottom emission type apparatus, although a lower-layer-side reflecting film having a semi-transparent reflecting property is formed at the lower-layer side of the anode, an insulating protective film is formed between the anode and the lower-layer-side reflecting film having a semi-transparent reflecting property, so that deterioration of the lower-layer-side reflecting film can be prevented.

Figure 3:
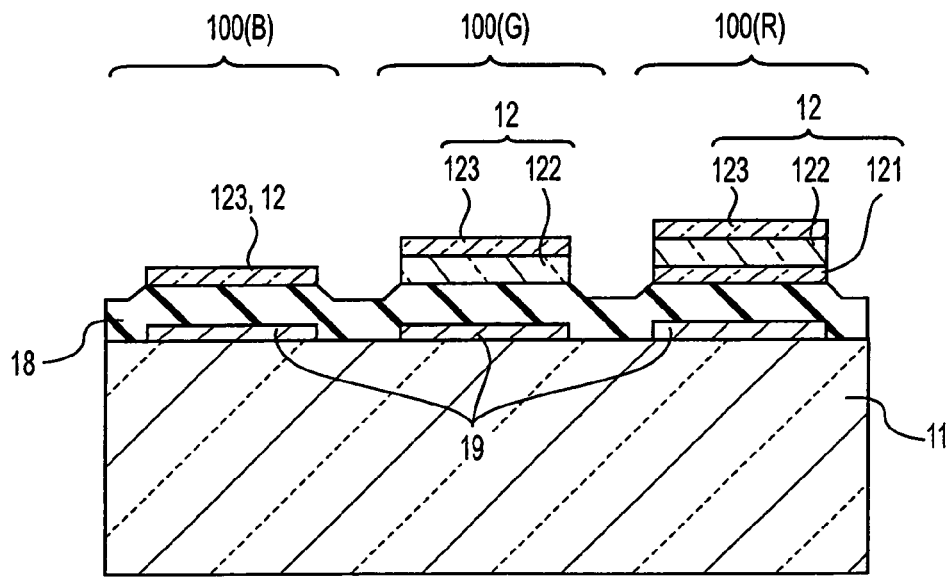
FIG. 3 is a view for explaining an example for forming different thicknesses of anode in an organic EL apparatus employing the present invention.

In addition, in order to implement different thicknesses of the anode 12 for the pixels 100 (R), (G), and (B), when the ITO film is formed, thicknesses of the ITO films in three film-forming processes may be different from each other. Alternatively, as shown in FIG. 3, there may be employed a construction where a three-layered structure of a firstly formed ITO film 121, a secondly formed ITO film 122, and a thirdly formed ITO film 123 is used for the pixel 100 (R), a two-layered structure of the secondly formed ITO film 122 and the thirdly formed ITO film 123 is used for the pixel 100 (G), and a single-layered structure of the thirdly formed ITO film 123 is used for the pixel 100 (B).

Application to Display Apparatus

The organic EL apparatus 1 employing the invention may used as a passive or active matrix type display apparatus. The active matrix type display apparatus among the display apparatuses has an electrical construction shown in FIG. 4.

Figure 4:
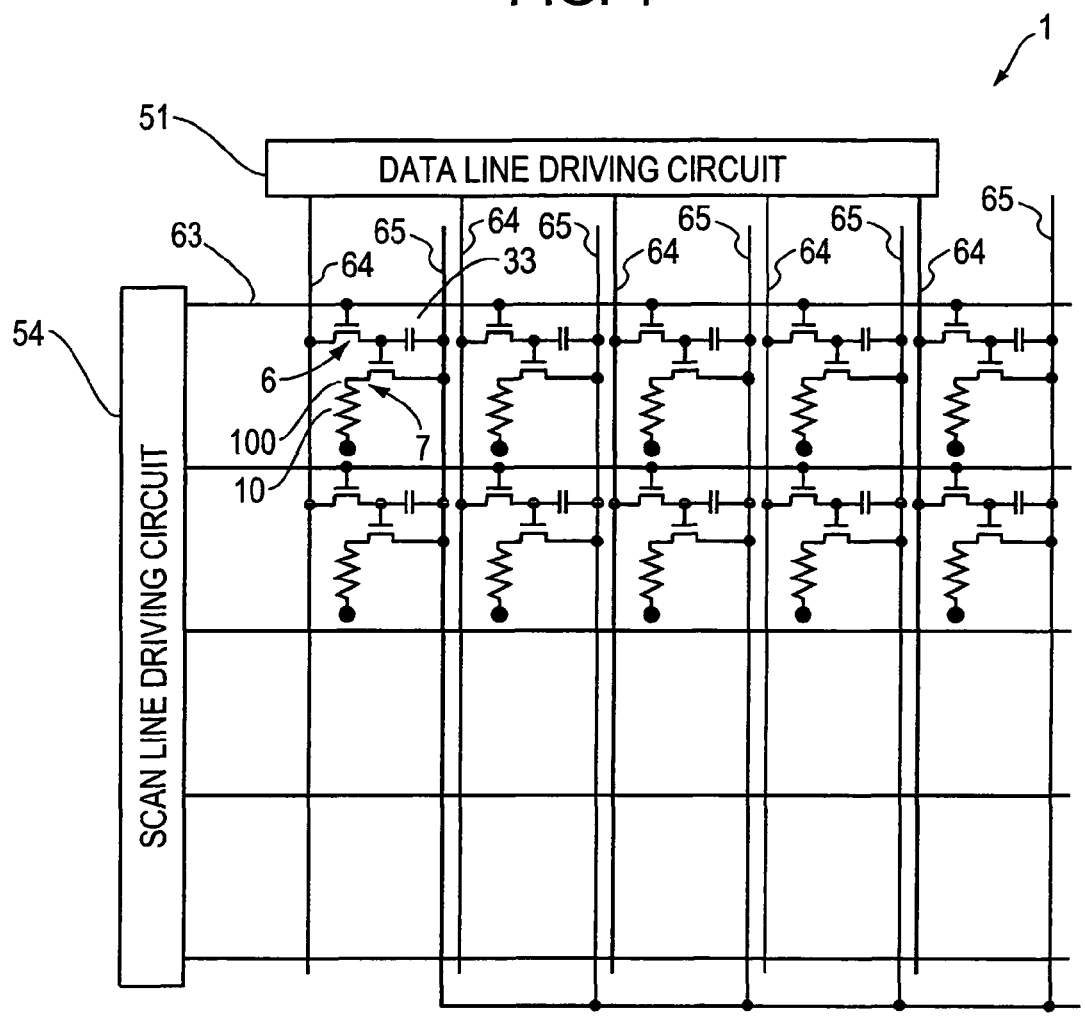
FIG. 4 is a block diagram showing an electrical construction of an active matrix type organic EL apparatus.

FIG. 4 is a block diagram showing the electrical construction of the active matrix type organic EL apparatus. In FIG. 4, the organic EL apparatus 1 includes a plurality of scan lines 63, a plurality of data lines 64 disposed to extend in a direction intersecting an extending direction of the scan lines 63, plurality of common current-feed lines 65 parallel to the data lines 64, and pixels 100 (light-emitting regions) corresponding to intersections of the data lines 64 and the scan lines 63, and the pixels 100 are arrayed in matrix on an image display region. A data line driving circuit 51 including shift registers, level shifters, video lines, and analog switches is provided to drive the data lines 64. A scan line driving circuit 54 including shift registers and level shifters is provided to drive the scan lines 63. In addition, each of the pixels 100 includes a pixel-switching thin film transistor 6 having a gate electrode to which a scan signal is applied through the scan line 63, a storage capacitor 33 which stores an image signal supplied from the data line 64 through the thin film transistor 6, a current-controlling thin film transistor 7 having a gate electrode to which the image signal stored in the storage capacitor 33 is applied, and an organic EL device 10 to which a driving current is supplied from the common current-feed line when the organic EL device is electrically connected to the common current-feed line 65 through the thin film transistor 7. In addition, in organic EL apparatus 1, each of the pixels 100 corresponds to one of red (R), green (G), and blue (B).

Other Embodiments

Although the aforementioned embodiments employs the organic EL device as a light emitting device, the invention may be applied to a light emitting apparatus employing other light emitting devices. In any cases, the technical scope of the invention is not limited to the embodiments, but various modifications may be mad without departing from the scope of the invention.

Application to Electronic Apparatus

A light emitting apparatus to which the invention is applied may be used as a display apparatus for various electronic apparatus such as a mobile phone, a personal computer, and PDA. In addition, the light emitting apparatus to which the invention is applied may used as an exposing head for an image forming apparatus such as a digital copier and a printer.

What is claimed is:

1. A method of producing a light emitting apparatus, the method comprising:
    forming a metal layer having a reflective property;
    patterning the metal layer into reflecting layers;
    covering top and side surfaces of the reflecting layers with a light-transmitting insulating protective film;
    forming a conductive material film over the light-transmitting insulating protective film;
    patterning the conductive material film into anodes,
    the light-transmitting insulating protective film insulating the reflecting layers from the anodes, and
    the forming and patterning the conductive material film being performed repeated times to form anodes of different thicknesses.

2. The method according to claim 1, the light-transmitting insulating protective film filling an inter-reflecting layer space between adjacent reflecting layers.

3. The method according to claim 1, the light-transmitting insulating protective film covering all of the reflecting layers.

* * * * *